United States Patent [19]
Ouellet

[11] Patent Number: 5,470,798
[45] Date of Patent: Nov. 28, 1995

[54] MOISTURE-FREE SOG PROCESS

[75] Inventor: Luc Ouellet, Granby, Canada

[73] Assignee: Mitel Corporation, Kanata, Canada

[21] Appl. No.: 965,264

[22] PCT Filed: May 28, 1991

[86] PCT No.: PCT/CA91/00176

§ 371 Date: Jan. 26, 1993

§ 102(e) Date: Jan. 26, 1993

[87] PCT Pub. No.: WO91/19316

PCT Pub. Date: Dec. 12, 1991

[30] Foreign Application Priority Data

May 29, 1990 [CA] Canada ........................... 2017719

[51] Int. Cl.[6] .............................................. H01L 21/469
[52] U.S. Cl. ...................... 437/231; 437/240; 437/982; 148/DIG. 133
[58] Field of Search ....................... 437/231, 240, 437/982, 187; 148/DIG. 133; 118/719

[56] References Cited

U.S. PATENT DOCUMENTS

| | | | |
|---|---|---|---|
| 4,775,550 | 10/1988 | Chu et al. | 437/213 |
| 4,885,262 | 12/1989 | Ting et al. | 437/231 |
| 4,962,063 | 10/1990 | Maydan et al. | 437/240 |
| 5,112,776 | 5/1992 | Marks et al. | 437/240 |
| 5,204,288 | 4/1993 | Marks et al. | 437/240 |

FOREIGN PATENT DOCUMENTS

| | | | |
|---|---|---|---|
| 63-281434 | 11/1988 | Japan | 437/231 |
| 112528 | 11/1989 | Japan | 437/231 |
| 3165034 | 7/1991 | Japan . | |
| 4320032 | 11/1992 | Japan | 437/231 |
| 9119317 | 12/1991 | WIPO | 437/231 |

*Primary Examiner*—Brian E. Hearn
*Assistant Examiner*—Michael Trinh
*Attorney, Agent, or Firm*—Marks & Clerk

[57] ABSTRACT

In a method of planarizing a semiconductor wafer having aluminum interconnect tracks formed thereon, a method is disclosed for applying inorganic spin-on glass which comprises applying the spin-on glass to the wafer in a coating and spinning chamber in a moisture-free environment, transferring the wafer in a moisture-free environment to a curing station, curing the spin-on glass at a temperature in the range of about 80° to 250° C. in the moisture-free environment at the curing station, and returning the wafers to the coating and spinning chamber. The above steps are repeated until a sufficient film thickness has been achieved without in the interim exposing the wafer to moisture conditions such that reverse hydrolysis si minimized during the planarization process. In this way crack-free inorganic SOG films can be produced.

7 Claims, 2 Drawing Sheets

MOISTURE-FREE SOG PROCESS

BACKGROUND OF THE INVENTION

1. Field of the Invention

This invention relates generally to a process for applying spin-glass to a substrate, and more particularly to a process for the planarization of semiconductor wafers. The invention is especially applicable to inorganic spin-on glasses.

2. Description of the Prior Art

Spin-on glasses (SOG) are proprietary liquid solutions containing siloxane or silicate based monomers diluted in various kinds of solvents or alcohols. They are commonly used for the planarization of semiconductor wafers, i.e. the filling and levelling of the trenches formed between interconnect paths deposited on the wafer. On coating and curing of spin-on glasses, monomers are polymerized by condensation and release of water, solvent, and alcohol. The condensed material is a thin solid film having mechanical, chemical and electrical properties which depend on the starting solution, and the coating and curing process.

There are more than one hundred different SOG solutions currently available. These are classified into two major families:

1) Inorganic silicates.
2) Quasi inorganic siloxanes (methyl-siloxanes, ethyl-, phenyl-, butyl-).

The difficulty of using silicate SOGs for the planarization of low-melting point materials, such as aluminum has caused a worldwise trend not to use purely inorganic silicate (including phosphosilicate) SOGs and to use instead members of the quasi-inorganic siloxane family.

However, there are significant disadvantages in using quasi-inorganic SOGs relating to their electric properties, and their use is becoming uncertain for advanced applications.

A further problem is caused by the absorption of water during curing. SOGs, particularly phosphorus alloyed SOGs, are extremely hygroscopic materials, and rapidly absorb ambient moisture during curing. This moisture pick-up promotes the irreversible reactions described above, and the resulting SOG films have poor properties and reliability.

SUMMARY OF THE INVENTION

An object of the invention is to alleviate the aforementioned problems by permitting the obtention of higher quality SOG films, mainly inorganic SOG films, over aluminum or other materials that cannot tolerate high temperature processing.

In accordance with the present invention the spin-on glass is an inorganic spin-on glass which is applied in the following manner:

(i) the spin-on glass is applied to the wafer in a coating and spinning chamber in a moisture-free environment;

(ii) the wafer is transferred in a moisture-free environment to a curing station;

(iii) the spin-on glass is cured still in a moisture-free environment; and (iv) steps (i) to (iii) are repeated until a sufficient film thickness has been achieved without in the interim exposing the wafer to ambient conditions such that reverse hydrolysis is minimized during the planarization process.

The various components of a SOG solution (silicon containing oligomer, solvents mixture, and residual water) are in equalibrium in the liquid phase. Immediately after coating, volatile products (solvents and water) evaporate, and polymerization occurs due to the formation by condensation of silanol, Si—OH bonds. These produce more water according to the following reaction:

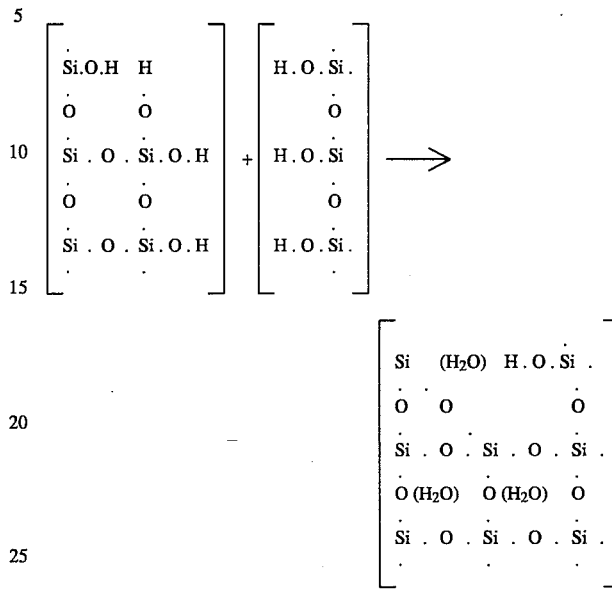

Polymerization continues until the distance between neighboring silanol groups, Si—OH, becomes too large or when too much by-product, such as water, blocks the condensation reaction. Heating is then required to permit further densification.

Both families of SOG solutions can incorporate boron or phosphorus organometallic catalyst to improve the properties of the films, such as: higher density, reduced hydrogen content, higher coefficient of thermal expansion, better flexibility and higher resistance to cracking. In the SOG solution, the boron or phosphorus organometallic molecules are generally not well bonded to the silicon-containing compounds. Strong bonding generally occurs in the solid state when the film is exposed to relatively high temperatures. These organometallic molecules can nevertheless polymerize in the solution to form poorly bonded polymers that dissociate and form stable polymers during coating and condensation of the film. As an example, a Japanese SOG solution is alloyed with a phosphorus organometallic molecule, $P_wO_x(OH)_y(OC_2H_5)_z$, which is in dynamic equilibrium with the solutions water and ethanol, $C_2H_5OH$:

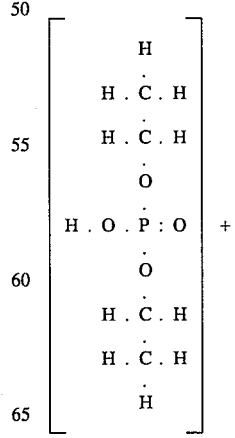

-continued

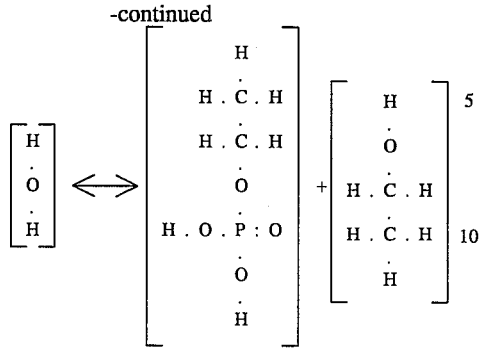

network with three P·O·Si bonds. These bonds are formed by the condensation of —P·OH or —P·OC$_2$H$_5$, and —Si·OH. Water and ethanol are formed as by-products and water must be eliminated quickly to prevent reverse hydrolysis.

If the ethanol C$_2$H$_5$OH, or water concentration suddenly drops, as during coating and solvent evaporation, the equilibrium is broken and, at high temperatures, the phosphorus organometallic molecule will polymerize and connect to the forming SiO$_x$H$_y$ film by producing more water and ethanol, C$_2$H$_5$OH:

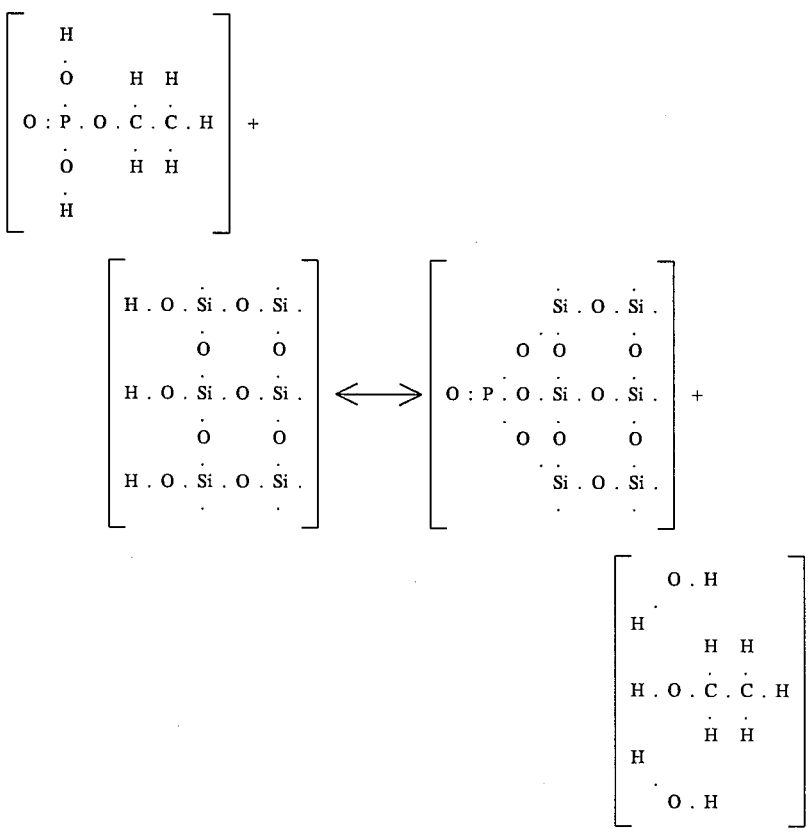

In theory, the phosphorus atom connects to the SiO$_2$

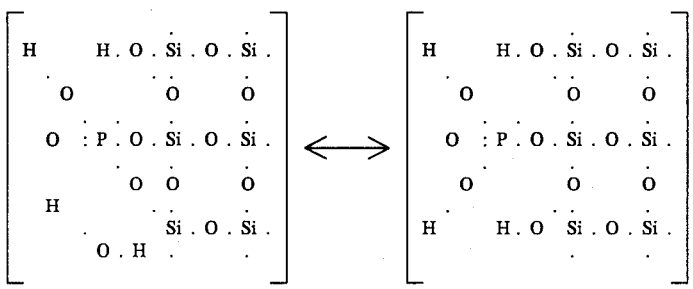

These revere hydrolysis is extremely undesirable because it contributes to the incorporation of hydrogen and inhibits the action of the phosphorus organometallic catalyst.

Residual hydrogen forms silanol groups, SiOH. It is very difficult to remove and causes serious yield and reliability problems. If this reverse hydrolysis continues, it is possible to totally disconnect the phosphorus by forming many different acids: hypo-phosphorus acid, $H_3PO_2$; meta-phosphorus acid, $HPO_2$; pyro-phosphorus acid, $H_4P_2O_5$; ortho-phosphorus acid, $H_3PO_3$; hypo-phosphoric acid, $H_4P_2O_6$; meta-phosphoric acid, $HPO_3$; pyro-phosphoric acid, $H_4P_2O_7$; and ortho-phosphoric acid, $H_3PO_4$. As an example, the formation of ortho-phosphoric, $H_3PO_4$, due to reverse hydrolysis by residual or ambient moisture, is:

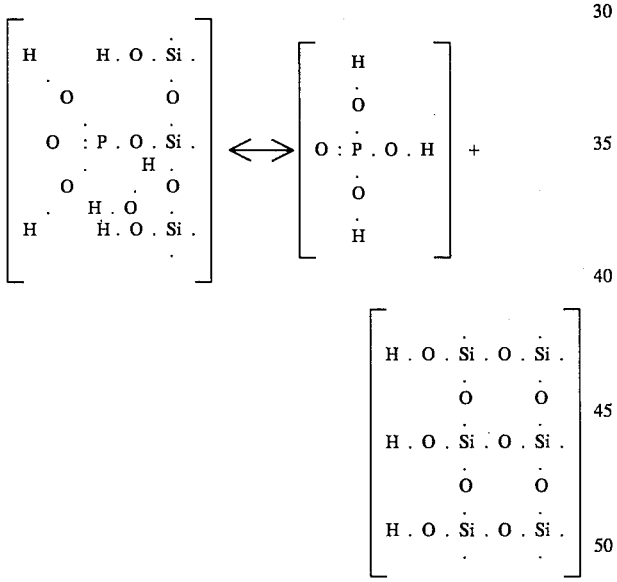

The acids that are formed corrode aluminum interconnects. Consequently, for planarization over aluminum interconnects, when maximum temperature is limited to about 450° C. or so, serious problems are encountered with film quality and reliability.

These effects are not observed in the planarization of dielectrics over refractory materials, such as polysilicon, silicides and refractory metals, that allow very high temperature curing (over 800° C.) due to more complete thermally induced condensation of pairs of silanol bonds, Si—OH, over long distances. This type of planarization over refractory materials is relatively easy.

By eliminating the moisture from the curing process, a dense, low hydrogen content, high coefficient of thermal expansion, flexible, crack-resistant and corrosion-free SOG film can be produced.

After deposition of the first layer of dielectric, the spin-on glass coating/cure process is preferably carried out with a dedicated SOG processor, typically in the following manner, which is described with reference to the planarization of a series of semiconductor wafers:

a) The wafer is transported from sending cassette to a coating chamber.

b) a few ml of a SOG solution are dispensed at the centre of the wafer to be planarized.

c) The wafer is spun at a given RPM to spread uniformly the solution and to permit the evaporation of volatile compounds and film solidification.

d) For SOG curing, the wafer is sequentially transported to in-line hot plates which are temperature controlled at temperature roughly between 80° C. and 250° C.

e) The wafer is slightly cooled at an idle station.

f) The wafer is stored and cooled in a receiving cassette.

g) When all the wafers are received in the receiving cassette, they are all together transferred to the sending cassette for a second coat (steps a to f are repeated). Such a transfer can be carried out in any standard laboratory transfer chamber. When all the wafers are received in receiving cassette, they are all together transferred to the sending cassette for a third coat (steps a to f are again repeated).

h) When sufficient coats have been applied, the wafers are transferred to the station for the next process step.

During steps a) to g), an operation lasting about two hours, the wafers are not exposed to ambient atmosphere and, unlike the prior art, are maintained in a moisture-free environment. As a result, the SOG films, particularly phosphorus alloyed SOG films, cannot therefore absorb ambient moisture and extremely high quality films are produced.

The invention also relates to an apparatus for applying spin-on glass (SOG) to a substrate over low-melting point, non-refractory materials such as aluminum, which provides a moisture-free environment for the application of said spin-on glass to minimize reverse hydrolysis during curing.

BRIEF DESCRIPTION OF THE DRAWINGS

The invention will now be described in more detail, by way of example only, with reference to the accompanying drawings in which.

DESCRIPTION OF THE PREFERRED EMBODIMENTS

SOG processing equipment for coating and in-line curing of the SOG film is relatively new. Previous generations of SOG processors do not allow wafer manipulations, SOG coating, in-line curing, cooling and storage under continuously controlled ambient stations.

Figure 1A:
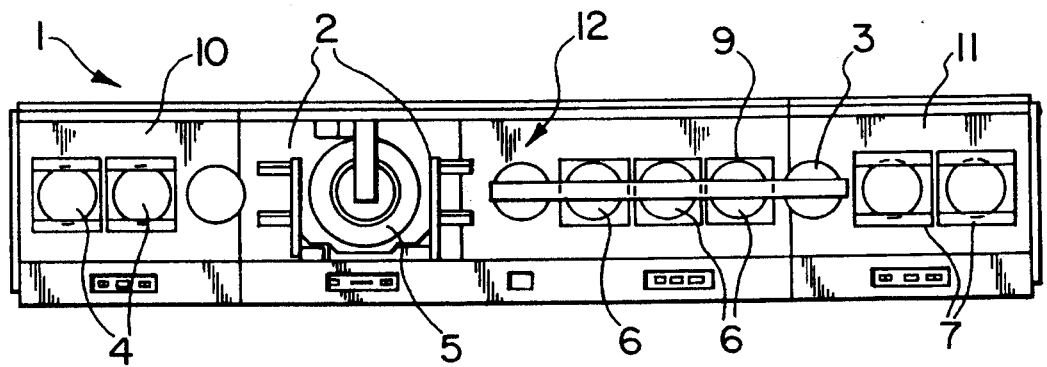
FIGS. 1a and 1b show respectively plan and side views of a SOG planarization apparatus for carrying out the process according to the present invention.
Figure 1B:
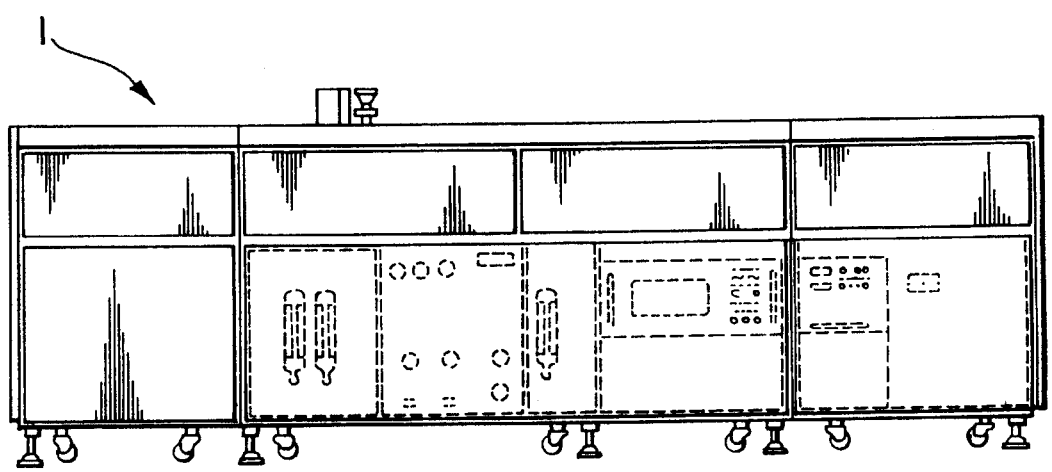

These in-line ambient controlled stations are provided in the SOG processor shown in FIG. 1. Referring now to FIG. 1, the SOG processor comprises a main unit 1 defining a plurality of processing stations. The unit includes sending cassettes 4, transport mechanisms 2, in-line cure plates 6 (up to 9), and receiving cassettes 7. The unit 1 further has a coating area 5 and cooling area 3.

More particularly, the SOG processor comprises the following elements:

1) One or more sending cassettes 4 at a sending station 10 to store the wafers to be processed.
2) Transport mechanism 2 to transfer, one by one, the wafers from the sending cassette to the coating area.
3) Coating area 5 where the SOG coating and wafer spinning is done.
4) Transport mechanism 2 to transfer the coated wafer from the coating area to the first in-line temperature controlled hot plate.
5) A first in-line hot plate area 8.
6) Transport mechanism 2 to transfer the wafer from the one in-line hot plate to the next.
7) A last in-line hot plate area 9.
8) A transport mechanism to transfer the wafer from the last in-line hot plate to a wafer cooling area.
9) A wafer cooling area 7.
10) A transport mechanism to transfer the wafer from the wafer cooling area to a receiving cassette area.
11) One or more receiving cassettes 7 at a receiving station 11 to store the wafers that received the first SOG coat.

The entire processor is provided in an inert environment, schematically illustrated at 12. The inert gas ambient protects the wafer at locations 1 to 11. The inert gas is typically nitrogen, but can be argon or any other noble gas or any other non-reactive moisture-free gas. This gas prevents reverse hydrolysis and permits the production of films with considerably improved properties.

Figure 2:
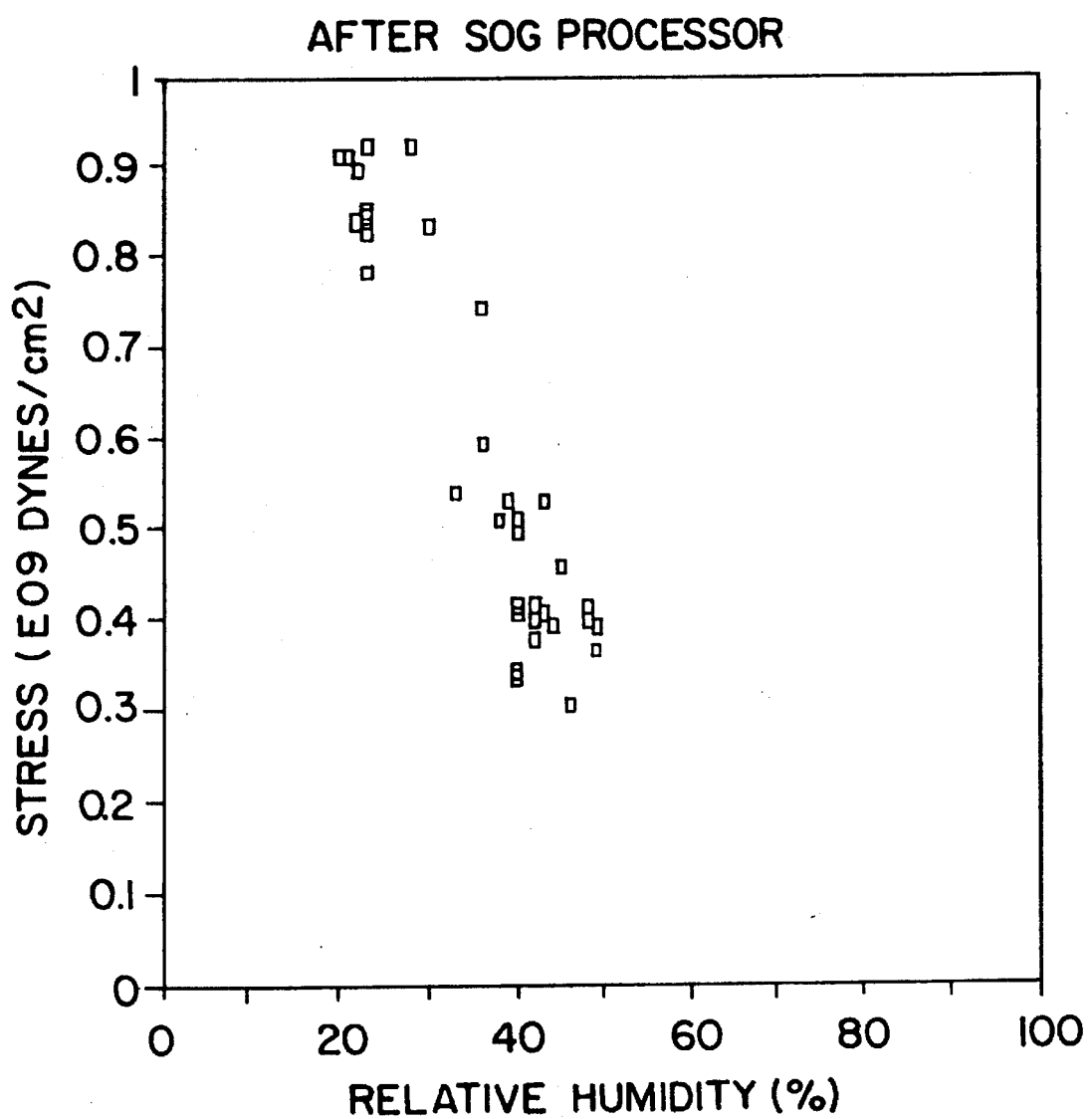
FIG. 2 is a plot of the stress in a SOG film plotted against relative humidity.

In order to determine the effects of moisture on film properties, various SOG films were prepared using the apparatus shown in FIG. 1. The results are shown in FIG. 2. Film stress was monitored for films processed under uncontrolled atmospheric ambient and correlated with relative humidity to show its effect on film properties.

Moisture pick-up and reverse hydrolysis pushes SOG film stress toward compression (less tensile) because of an internal volumetric expansion due to the formation of silanol, Si—OH, pairs from more compact Si—O—Si bonds.

The water pick-up effect is shown in FIG. 2, which shows that the equilibrium SOG mechanical stress is mainly controlled by relative humidity. The compressive stress effect due to the formation of silanol pairs is effectively observed; the higher the relative humidity, the lower the tensile stress.

Since the ambient conditions such as dew point, relative humidity, and duration of the ambient exposure are not constant from wafer to wafer and day to day, the resulting films properties fluctuate and manufacturing is difficult.

While the invention is mainly applicable to inorganic SOGs, it can be applied with success to quasi-inorganic SOGs. Either type can be alloyed or not with phosphorus, boron, arsenic or lead. The benefits of the invention are more noticeable with alloyed SOGs, but, since a non-alloyed SOG is also extremely hygroscopic, the technique also apply to unalloyed SOGs.

The number of coats can vary. Generally speaking, the higher the number of coats, the better the end results.

The in-line high temperature hot plates can be replaced by an in-line oven, an in-line plasma cure device, an in-line microwave device, or an in-line ozone device, or an in-line UV-ozone device, to permit cure in a moisture-free gas.

This inert gas it typically nitrogen, but can be argon or another noble gas, any other moisture free gas, or a mixture thereof. It can be heated or at room temperature.

The inert gas ambient can also be replaced by vacuum which is also a moisture-free environment. The gas can be ionized (plasma) or not.

The equipment described is an in-line one-wafer-at-a-time processor but the invention also extends to single wafer or batch systems where the SOG can be applied by spin coating, immersion, spraying or other techniques that can be used to apply the SOG film to a substrate in which the environment is controlled.

While the invention has been described in connection with semiconductor planarization techniques, it can be applied to other operations, such as:

a) To other steps in the manufacturing of IC's
   Diffusion source
   Dielectric layer
   Diffusion barrier
   Encapsulation
   Adhesion layer
   Buffer layer
   Antireflective layer
   Corrosion protection layer To other semiconductor devices:
   Emission diodes
   Liquid crystal display
   Electro chromic display
   Photodetectors
   Solar batteries
   Sensors To other fields:
   Optical fibers
   Corrosion protection
   Adhesion promoters
   Friction reduction
   Optical/thermal reflectance adjustments

I claim:

1. A method of planarizing a semiconductor wafer having interconnect tracks of non-refractory material formed thereon, comprising the steps of:

i) applying a layer of inorganic phosphorus-based spin-on glass to the wafer in a coating and spinning chamber in the absence of moisture;

ii) transferring the wafer in the absence of moisture to a curing station;

(iii) curing the spin-on glass at a temperature in the range of at least about 80° C. and not more than 450° C. in the absence of moisture at said curing station to form an $SiO_2$ lattice connected to phosphorus atoms;

(iv) returning the wafer to the coating and spinning chamber and repeating steps (i) to (iii) until a sufficient film thickness has been achieved without in the interim exposing the wafer to moisture so as to minimize reverse hydrolysis during a planarization process and thereby prevent irreversible reactions that form phosphorus acids and thus lead to disconnection of the phosphorus atoms from the SiO$_2$ lattice.

2. A method as claimed in claim 1, wherein steps (i) to (iii) are carried out in an inert gas free of moisture.

3. A method as claimed in claim 2, wherein said inert gas is selected from the group consisting of: nitrogen and argon.

4. A method as claimed in claim 1, wherein steps (i) to (iii) are carried out in a vacuum.

5. A method as claimed in claim 1, wherein said spin-on glass is a phosphorus-alloyed spin-on glass.

6. A method as claimed in claim 1, further comprising the steps of:

1) placing the wafer(s) to be processed in a sending cassette;

2) transferring the wafers one by one from the sending cassette to the coating and spinning chamber;

3) dispensing a few ml of SOG solution at the center of the wafer, and spinning said wafer;

4) transferring the coated wafers from the coating and spinning chamber to a first in-line temperature controlled hot plate;

5) transferring the wafers from the said first in-line hot plate to the next and so on to the last in-line hot plate;

6) transferring the wafers from the last in-line hot plate to a wafer cooling zone;

7) transferring the wafers from the wafer cooling zone to a receiving cassette zone; and 8) storing the wafer that have received a first spin-on glass coat in a receiving cassette; and 9) repeating steps 1 to 8 as many times as required until a sufficient film thickness has been achieved.

7. A method as claimed in claim 1, wherein said non-refractory material is aluminum.

* * * * *